(12) United States Patent
Lastusaari et al.

(10) Patent No.: US 10,640,704 B2
(45) Date of Patent: *May 5, 2020

(54) LUMINESCENT MATERIAL

(71) Applicant: TURUN YLIOPISTO, Turun Yliopisto (FI)

(72) Inventors: Mika Lastusaari, Turku (FI); Isabella Norrbo, Turku (FI)

(73) Assignee: TURUN YLIOPISTO, Turun Yloiopisto (FI)

(*) Notice: Subject to any disclaimer, the term of this patent is extended or adjusted under 35 U.S.C. 154(b) by 0 days.

This patent is subject to a terminal disclaimer.

(21) Appl. No.: 16/099,649

(22) PCT Filed: May 23, 2016

(86) PCT No.: PCT/FI2016/050349
§ 371 (c)(1),
(2) Date: Nov. 7, 2018

(87) PCT Pub. No.: WO2017/194825
PCT Pub. Date: Nov. 6, 2017

(65) Prior Publication Data
US 2019/0153314 A1    May 23, 2019

(30) Foreign Application Priority Data
May 9, 2016 (FI) .................................. 20165392

(51) Int. Cl.
*C09K 11/67* (2006.01)
*C09K 11/77* (2006.01)
(Continued)

(52) U.S. Cl.
CPC .............. *C09K 11/676* (2013.01); *C09K 9/00* (2013.01); *C09K 11/646* (2013.01);
(Continued)

(58) Field of Classification Search
CPC .... C09K 11/676; C09K 11/685; C09K 11/689
See application file for complete search history.

(56) References Cited

U.S. PATENT DOCUMENTS 2,752,521 A * 6/1956 Ivey ........................ C09K 9/00
313/465
2,761,846 A   9/1956 Medved
(Continued)

FOREIGN PATENT DOCUMENTS

EP   1681335 A2   7/2006
WO   2010070290 A1   6/2010

OTHER PUBLICATIONS

Gaft et al, "Lase-induced Time-resolved luminescence of tugtupite, sodalite and hacknnanite", Phys. Chem. Minerals, (2009) 36, Sep. 19, 2008; pp. 127-141.*
(Continued)

*Primary Examiner* — C Melissa Koslow
(74) *Attorney, Agent, or Firm* — Brooks Kushman P.C.

(57) ABSTRACT

The invention relates to a material represented by the following formula (I)

$$(M')_8(M''M''')_6O_{24}(X,X')_2:M''''$$    formula (I).

Further, the invention relates to a luminescent material, to different uses, and to a device.

18 Claims, 1 Drawing Sheet

(51) Int. Cl.
C09K 11/64 (2006.01)
C09K 9/00 (2006.01)
G01T 1/06 (2006.01)
G01T 1/16 (2006.01)

(52) U.S. Cl.
CPC ...... *C09K 11/7734* (2013.01); *C09K 11/7749* (2013.01); *G01T 1/06* (2013.01); *G01T 1/1606* (2013.01)

(56) References Cited

U.S. PATENT DOCUMENTS 3,923,529 A * 12/1975 Araujo .................... C03C 3/062
501/42
4,490,286 A * 12/1984 Volynets ................ G03C 1/725
252/301.4 F
5,581,090 A    12/1996 Goudji

OTHER PUBLICATIONS

Norrbo et al, "mechanisms of Tenebrescence and Persistent Luminescence in Synthetic Hackmanite Na8Al6Sio24(Ci,S)2", Applied Materials & Interfaces, 8, Apr. 18, 2016; pp. 11592-11602.*
Zahoransky et al, "Luminescence and tenebrescence of natural sodalites: a chemical and structural study", Phys. Chem. Minerals (2016) 43, Apr. 28, 2016; pp. 459-480.*
Aidilibike et al., Near-Infrared Photoluminescence Properties of Natural Sodalite Activated with Mn and Fe Transition Metal Ions Doping, Spectroscopy and Spectral Analysis; vol. 33, No. 11, pp. 2926-2929, Nov. 2013; 4 pages.
Armstrong et al., Structural Observation of Photochromism; Royal Society of Chemistry—Chemistry Communication, 2006; pp. 1094-1096.
Finish Patent and Registration Office Search Report, dated Nov. 14, 2016; 2 pages.
Gaft et al., Laser-induced Time-resolved Luminescence of Tugtupite, Sodalite, and Hackmanite; Phys Chem Minerals (2009) 36: pp. 127-141.
International Search Report; PCT/FI2016/050349; dated Aug. 23, 2016; 5 pages.
Van Doorn et al., Optical Investigation of Cathodochormic Sodalite; J. Electrochem. Soc.: Solid-State Science and Technology; Jan. 1972; pp. 85-92.
Webb et al., Know Your Standard: Clarifying the CIE Erythema Action Spectrum; Photochemistry and Photobiology, 2011, 87, pp. 483-486.
Zahoransky et al., Luminescence and Tenebrescence of Natural Sodalites: A Chemical and Structural Study; Phys Chem Minerals (2016) 43: 459-480.
Norrbo, Isabella et al. Mechanisms of Tenebrescence and Persistent Luminescence in Synthetic Hackmanite Na8A163i6024(Cl,S)2, ACS, Applied Materials and Interfaces, vol. 8, 2016, 11592-11602 (published online Apr. 18, 2016) chapters 1,2.1, 3.1, 3.2 and 4, 11 pages.
Norrbo, Isabella et al. Persistent Luminescence of Tenebrescent Na 8 A16 Si 6 0 24(Cl,S) 2: Multifunctional Optical Markers, Inorganic Chemistry, vol. 54, No. 16, Aug. 6, 2015, pp. 7717-7724, & Supporting Information chapters 1 and 4; table S2 in Supporting Information, 14 pages.
Akhmetov N.S., Inorganic Chemistry, 1975, 582, 648, 649, 654 Higher School, Moscow.
Barsanov G.N., Sheveleva V.A., Materials on the Study of the Luminescence of Minerals, Proceedings of the Mineralogical Museum, 1952, 20, 24, 4.

* cited by examiner

LUMINESCENT MATERIAL

CROSS-REFERENCE TO RELATED APPLICATION

This application is the U.S. national phase of PCT Application No. PCT/FI2016/050349 filed on May 23, 2016, which claims priority to FI Patent Application No. 20165392 filed on May 9, 2016, the disclosures of which are incorporated in their entirety by reference herein.

FIELD OF THE INVENTION

The invention relates to a material, to a luminescent material, to a device, and to uses of the material.

BACKGROUND OF THE INVENTION

There are various light emitting components and devices based on a light emitting element, wherein the color or wavelength of the light emitted by the light emitting element must be converted into one or more other colors or wavelengths. A typical example is a white LED, where the initial wavelength range e.g. in the ultraviolet, blue, or green portion of the spectrum is converted into white light comprising several wavelength ranges. White light is used e.g. in illumination applications. Other typical examples of luminescent components and devices where wavelength conversion is used are various displays for presenting alphanumerical and graphical information, backlight units, as well as fluorescent lamps.

The wavelength conversion is typically made by means of a luminescent material receiving and absorbing the light of a first wavelength range emitted by the light emitting element, and emitting the absorbed energy at one or more other wavelength ranges.

There is a variety of different luminescent materials, often called "phosphors", for this purpose known in the art. However, the longest emitting afterglow materials contain either rare earth elements (lanthanides) or other heavy metal elements. Examples of such long and brightly emitting commercially used materials are e.g. $Sr_2MgSi_2O_7$:Eu,Dy (blue color), $CaAl_2O_4$,Eu,Nd (blue color), $Sr_4Al_{14}O_{25}$:Eu, Dy (blue/green color), $SrAl_2O_4$:Eu,Dy (green color) and $Y_2O_2S$:Eu,Mg,Ti (red color). The longest persistent reported is in the near infrared (NIR) and it has been observed for $Zn_3Ga_2Ge_2O_{10}$:Cr (invisible emission, over 360 h persistence). The prior art also recognizes some white afterglow materials of which e.g. $CdSiO_3$:Dy, $Y_2O_2S$:Ti, $CaSnO_3$:Tb, and $Ca_2MgSi_2O_7$:Dy have the longest afterglows.

All of the best performing materials thus contain rare earth metals and/or other heavy metal elements. The necessity to use rare earth metals as well as elements like Bi and Ge increase the production costs of these materials. Moreover, heavy metal elements, such as Cd, are commonly not considered healthy either for the environment or humans. The inventors have therefore recognized the need for a new material providing a long afterglow without any rare earth metals or other heavy metal ions.

Purpose of the Invention

The purpose of the invention is to provide a new type of material and its use. Further, the purpose of the invention is to provide a luminescent material and its use. Further, the purpose of the invention is to provide a device.

SUMMARY

The material according to the present invention is characterized by what is presented in the following material claims.

The luminescent material according to the present invention is characterized by what is presented in the following device claim.

The device according to the present invention is characterized by what is presented in the following device claim.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE INVENTION

Figure 1:
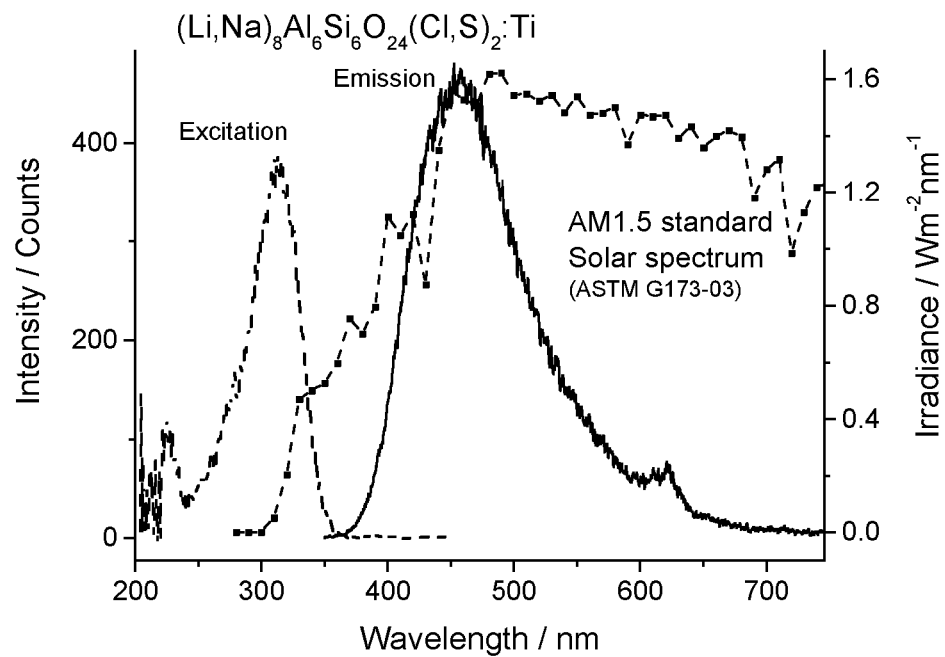
FIG. 1 discloses the test results of example 4.

The present invention relates to a material represented by the following formula (I)

$$(M')_8(M''M''')_6O_{24}(X,X')_2:M'''' \qquad \text{formula (I)}$$

wherein

M' represents a monoatomic cation of an alkali metal selected from Group 1 of the IUPAC periodic table of the elements, or any combination of such cations;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or of an element selected from any of Groups 13 and 15 of the IUPAC periodic table of the elements, or of Zn, or any combination of such cations;

X represents an anion of an element selected from Group 17 of the IUPAC periodic table of the elements, or any combination of such anions, or wherein X is absent;

X' represents an anion of an element selected from Group 16 of the IUPAC periodic table of the elements, or any combination of such anions, or wherein X' is absent; and M'''' represents a dopant cation of an element selected from transition metals of the IUPAC periodic table of the elements, or any combination of such cations;

with the proviso that at least one of X and X' is present.

In one embodiment, M' represents a monoatomic cation of an alkali metal selected from a group consisting of Na, Li, K, and Rb, or any combination of such cations. In one embodiment, M' represents a monoatomic cation of an alkali metal selected from a group consisting of Li, K, and Rb, or any combination of such cations.

In one embodiment, M' represents a monoatomic cation of an alkali metal selected from Group 1 of the IUPAC periodic table of the elements, or any combination of such cations; with the proviso that M' does not represent the monoatomic cation of Na alone. In one embodiment, M' does not represent the monoatomic cation of Na alone.

The material is a synthetic material. I.e. the material is synthetically prepared. The present invention relates to a synthetic material represented by the following formula (I)

$$(M')_8(M''M''')_6O_{24}(X,X')_2:M'''' \quad \text{formula (I)}$$

wherein

M' represents a monoatomic cation of an alkali metal selected from Group 1 of the IUPAC periodic table of the elements, or any combination of such cations;

M'' represents a trivalent monoatomic cation of an element selected from Group 13 of the IUPAC periodic table of the elements, or of a transition element selected from any of Groups 3-12 of the IUPAC periodic table of the elements, or any combination of such cations;

M''' represents a monoatomic cation of an element selected from Group 14 of the IUPAC periodic table of the elements, or of an element selected from any of Groups 13 and 15 of the IUPAC periodic table of the elements, or of Zn, or any combination of such cations;

X represents an anion of an element selected from Group 17 of the IUPAC periodic table of the elements, or any combination of such anions, or wherein X is absent;

X' represents an anion of an element selected from Group 16 of the IUPAC periodic table of the elements, or any combination of such anions, or wherein X' is absent; and M'''' represents a dopant cation of an element selected from transition metals of the IUPAC periodic table of the elements, or any combination of such cations;

with the proviso that at least one of X and X' is present.

The proviso that at least one of X and X' is present should in this specification, unless otherwise stated, be understood such that either X or X' is present, or such that both X and X' are present.

In this specification, unless otherwise stated, the expression "monoatomic ion" should be understood as an ion consisting of a single atom. If an ion contains more than one atom, even if these atoms are of the same element, it is to be understood as a polyatomic ion. Thus, in this specification, unless otherwise stated, the expression "monoatomic cation" should be understood as a cation consisting of a single atom. Hackmanite, which is a variety of sodalite material, is natural mineral having the chemical formula of Na$_8$Al$_6$Si$_6$O$_{24}$(Cl,S)$_2$. The inventors surprisingly found out that a synthetic hackmanite based material showing a long emitting afterglow can be prepared. The inventors surprisingly found out that the synthetic material, as a result of being subjected to e.g. ultraviolet radiation or sunlight has the technical effect of showing a long white color afterglow. In one embodiment, the wavelength of the emission of the material according to one or more embodiments described in this specification is 370-730 nm. In one embodiment, the peak of emission of the material according to one or more embodiments described in this specification is at about 515 nm.

In this specification, unless otherwise stated, the expressions "afterglow", "persistent luminescense", "phosphorescence", or any corresponding expression should be understood as referring to the phenomenon encountered in materials which make them glow in the dark after having been excited with ultraviolet or visible light or with higher energy radiation.

In one embodiment, M' represents a combination of at least two monoatomic cations of different alkali metals selected from Group 1 of the IUPAC periodic table of the elements.

In one embodiment, M' represents a combination of at least two monoatomic cations of different alkali metals selected from Group 1 of the IUPAC periodic table of the elements, and wherein the combination comprises at most 66 mole percent (mol-%) of the monoatomic cation of Na. In one embodiment, M' represents a combination of at least two monoatomic cations of different alkali metals selected from Group 1 of the IUPAC periodic table of the elements, and wherein the combination comprises at most 50 mol-% of the monoatomic cation of Na. In one embodiment, M' represents a combination of at least two monoatomic cations of different alkali metals selected from Group 1 of the IUPAC periodic table of the elements, and wherein the combination comprises at most 40 mol-% of the monoatomic cation of Na, or at most 30 mol-% of the monoatomic cation of Na, or at most 20 mol-% of the monoatomic cation of Na.

In one embodiment, M' represents a combination of at least two monoatomic cations of different alkali metals selected from Group 1 of the IUPAC periodic table of the elements, wherein the combination comprises 0-98 mol-% of the monoatomic cation of Na. In one embodiment, M' represents a combination of at least two monoatomic cations of different alkali metals selected from Group 1 of the IUPAC periodic table of the elements, wherein the combination comprises 0-100 mol-% of the monoatomic cation of K. In one embodiment, M' represents a combination of at least two monoatomic cations of different alkali metals selected from Group 1 of the IUPAC periodic table of the elements, wherein the combination comprises 0-100 mol-% of the monoatomic cation of Rb. In one embodiment, M' represents a combination of at least two monoatomic cations of different alkali metals selected from Group 1 of the IUPAC periodic table of the elements, wherein the combination comprises 0-100 mol-% of the monoatomic cation of Li.

In one embodiment, M' represents a combination of at least two monoatomic cations of different alkali metals selected from a group consisting of Li, Na, K, and Rb. In one embodiment, M' represents a combination of two monoatomic cations of different alkali metals selected from a group consisting of Li, Na, K, and Rb. In one embodiment, M' represents a combination of three monoatomic cations of different alkali metals selected from a group consisting of Li, Na, K, and Rb. In one embodiment, M' represents a combination of monoatomic cations of Li, Na, K, and Rb.

In one embodiment, M' represents a combination of a monoatomic cation of Na with a monoatomic cation of Li, a monoatomic cation of K and/or a monoatomic cation of Rb. In one embodiment, M' represents a combination of a monoatomic cation of Na with a monoatomic cation of K or a monoatomic cation of Rb. In one embodiment, M' represents a combination of a monoatomic cation of Na with a monoatomic cation of K and a monoatomic cation of Rb.

In one embodiment, M' represents a combination of a monoatomic cation of Na and a monoatomic cation of K; or a combination of a monoatomic cation of Na and a monoatomic cation of Rb; or a combination of a monoatomic cation of K and a monoatomic cation of Rb; or a combination of a monoatomic cation of Na, a monoatomic cation of K, and a monoatomic cation of Rb; or a combination of a monoatomic cation of K and a monoatomic cation of Rb.

In one embodiment, M' represents a combination of a monoatomic cation of Li and a monoatomic cation of Na; or a combination of a monoatomic cation of Li and a monoatomic cation of K; or a combination of a monoatomic cation of Li and a monoatomic cation of Rb; or a combination of a monoatomic cation of Li, a monoatomic cation of K, and a monoatomic cation of Rb; or a combination of a monoatomic cation of Li, a monoatomic cation of Na, a monoatomic cation of K and a monoatomic cation of Rb.

In one embodiment, M' represents a monoatomic cation of Li. In one embodiment, M' represents a monoatomic cation of K. In one embodiment, M' represents a monoatomic cation of Rb.

The inventors surprisingly found out that controlling the combination of at least two monoatomic cations of different alkali metals selected from Group 1 of the IUPAC periodic table of the elements makes it possible to adjust the effect of the material to change color and/or to show afterglow In one embodiment, M" represents a trivalent monoatomic cation of a metal selected from a group consisting of Al and Ga, or a combination of such cations.

In one embodiment, M" represents a trivalent monoatomic cation of B.

In one embodiment, M" represents a trivalent monoatomic cation of an element selected from a group consisting of Cr, Mn, Fe, Co, Ni, and Zn, or any combination of such cations.

In one embodiment, M''' represents a monoatomic cation of an element selected from a group consisting of Si, Ge, Al, Ga, N, P, and As, or any combination of such cations.

In one embodiment, M''' represents a monoatomic cation of an element selected from a group consisting of Si and Ge, or a combination of such cations.

In one embodiment, M''' represents a monoatomic cation of an element selected from a group consisting of Al, Ga, N, P, and As, or any combination of such cations.

In one embodiment, M''' represents a monoatomic cation of an element selected from a group consisting of Al and Ga, or a combination of such cations.

In one embodiment, M''' represents a monoatomic cation of an element selected from a group consisting of N, P, and As, or any combination of such cations.

In one embodiment, M''' represents a monoatomic cation of Zn.

In one embodiment, X represents an anion of an element selected from a group consisting of F, Cl, Br, I, and At, or any combination of such anions. In one embodiment, X represents an anion of an element selected from a group consisting of F, Cl, Br, and I, or any combination of such anions. In one embodiment, X is absent.

In one embodiment, X' represents an anion of an element selected from a group consisting of O, S, Se, and Te, or any combination of such anions. In one embodiment, X' represents an anion of S. In one embodiment X' is absent.

In one embodiment, the material is doped with at least one transition metal ion. In one embodiment, the material is represented by formula (I), wherein M'''' represents a cation of an element selected from transition metals of the IUPAC periodic table of the elements, or any combination of such cations. In one embodiment, M'''' represents a cation of an element selected from a group consisting of Ti, V, Cr, Mn, Fe, Co, Ni, Cu, and Zn, or any combination of such cations. In one embodiment, M'''' represents a cation of Ti.

In one embodiment, the material represented by the formula (I) comprises M'''' in an amount of 0.001-10 mol-%, or 0.001-5 mol-%, or 0.1-5 mol-% based on the total amount of the material.

In one embodiment, the material is selected from a group consisting of:
$(Li_xNa_{1-x-y-z}K_yRb_z)_8(Al,Ga)_6Si_6O_{24}(Cl,S)_2$:Ti,
$(Li_xNa_{1-x-y-z}K_yRb_z)_8(Al,Cr)_6Si_6O_{24}(Cl,S)_2$:Ti
$(Li_xNa_{1-x-y-z}K_yRb_z)_8(Al,Mn)_6Si_6O_{24}(Cl,S)_2$:Ti,
$(Li_xNa_{1-x-y-z}K_yRb_z)_8(Al,Fe)_6Si_6O_{24}(Cl,S)_2$:Ti,
$(Li_xNa_{1-x-y-z}K_yRb_z)_8(Al,Co)_6Si_6O_{24}(Cl,S)_2$:Ti,
$(Li_xNa_{1-x-y-z}K_yRb_z)_8(Al,Ni)_6Si_6O_{24}(Cl,S)_2$:Ti,
$(Li_xNa_{1-x-y-z}K_yRb_z)_8(Al,Cu)_6Si_6O_{24}(Cl,S)_2$:Ti,
$(Li_xNa_{1-x-y-z}K_yRb_z)_8(Al,B)_6Si_6O_{24}(Cl,S)_2$:Ti,
$(Li_xNa_{1-x-y-z}K_yRb_z)_8Mn_6Si_6O_{24}(Cl,S)_2$:Ti,
$(Li_xNa_{1-x-y-z}K_yRb_z)_8Cr_6Si_6O_{24}(Cl,S)_2$:Ti,
$(Li_xNa_{1-x-y-z}K_yRb_z)_8Fe_6Si_6O_{24}(Cl,S)_2$:Ti,
$(Li_xNa_{1-x-y-z}K_yRb_z)_8Co_6Si_6O_{24}(Cl,S)_2$:Ti,
$(Li_xNa_{1-x-y-z}K_yRb_z)_8Ni_6Si_6O_{24}(Cl,S)_2$:Ti,
$(Li_xNa_{1-x-y-z}K_yRb_z)_8Cu_6Si_6O_{24}(Cl,S)_2$:Ti,
$(Li_xNa_{1-x-y-z}K_yRb_z)_8B_6Si_6O_{24}(Cl,S)_2$:Ti,
$(Li_xNa_{1-x-y-z}K_yRb_z)_8Ga_6Si_6O_{24}(Cl,S)_2$:Ti,
$(Li_xNa_{1-x-y-z}K_yRb_z)_8Al_6(Si,Zn)_6O_{24}(Cl,S)_2$:Ti,
$(Li_xNa_{1-x-y-z}K_yRb_z)_8Al_6(Si,Ge)_6O_{24}(Cl,S)_2$:Ti,
$(Li_xNa_{1-x-y-z}K_yRb_z)_8Al_6Zn_6O_{24}(Cl,S)_2$:Ti,
$(Li_xNa_{1-x-y-z}K_yRb_z)_8Al_6Ge_6O_{24}(Cl,S)_2$:Ti,
$(Li_xNa_{1-x-y-z}K_yRb_z)_8Al_6(Ga,Si,N)_6O_{24}(Cl,S)_2$:Ti,
$(Li_xNa_{1-x-y-z}K_yRb_z)_8Al_6(Ga,Si,As)_6O_{24}(Cl,S)_2$:Ti,
$(Li_xNa_{1-x-y-z}K_yRb_z)_8Al_6(Ga,N)_6O_{24}(Cl,S)_2$:Ti,
$(Li_xNa_{1-x-y-z}K_yRb_z)_8Al_6(Ga,As)_6O_{24}(Cl,S)_2$:Ti,
$(Li_xNa_{1-x-y-z}K_yRb_z)_8(Al,Ga)_6Ge_6O_{24}(Cl,S)_2$:Ti,
$(Li_xNa_{1-x-y-z}K_yRb_z)_8(Al,Cr)_6Ge_6O_{24}(Cl,S)_2$:Ti,
$(Li_xNa_{1-x-y-z}K_yRb_z)_8(Al,Mn)_6Ge_6O_{24}(Cl,S)_2$:Ti,
$(Li_xNa_{1-x-y-z}K_yRb_z)_8(Al,Fe)_6Ge_6O_{24}(Cl,S)_2$:Ti,
$(Li_xNa_{1-x-y-z}K_yRb_z)_8(Al,Co)_6Ge_6O_{24}(Cl,S)_2$:Ti,
$(Li_xNa_{1-x-y-z}K_yRb_z)_8(Al,Ni)_6Ge_6O_{24}(Cl,S)_2$:Ti,
$(Li_xNa_{1-x-y-z}K_yRb_z)_8(Al,Cu)_6Ge_6O_{24}(Cl,S)_2$:Ti,
$(Li_xNa_{1-x-y-z}K_yRb_z)_8(Al,B)_6Ge_6O_{24}(Cl,S)_2$:Ti,
$(Li_xNa_{1-x-y-z}K_yRb_z)_8Mn_6Ge_6O_{24}(Cl,S)_2$:Ti,
$(Li_xNa_{1-x-y-z}K_yRb_z)_8Cr_6Ge_6O_{24}(Cl,S)_2$:Ti,
$(Li_xNa_{1-x-y-z}K_yRb_z)_8Fe_6Ge_6O_{24}(Cl,S)_2$:Ti,
$(Li_xNa_{1-x-y-z}K_yRb_z)_8Co_6Ge_6O_{24}(Cl,S)_2$:Ti,
$(Li_xNa_{1-x-y-z}K_yRb_z)_8Ni_6Ge_6O_{24}(Cl,S)_2$:Ti,
$(Li_xNa_{1-x-y-z}K_yRb_z)_8Cu_6Ge_6O_{24}(Cl,S)_2$:Ti,
$(Li_xNa_{1-x-y-z}K_yRb_z)_8B_6Ge_6O_{24}(Cl,S)_2$:Ti, and
$(Li_xNa_{1-x-y-z}K_yRb_z)_8Ga_6Ge_6O_{24}(Cl,S)_2$:Ti,
wherein $x+y+z \leq 1$, and $x \geq 0, y \geq 0, z \geq 0$.

In one embodiment, the material is selected from a group consisting of:
$(Li,Na)8(Al,Si)6O24(Cl,S)2$:Ti,
$(Na,K)8 (Al,Si)6O24(C,S)2$:Ti, and
$(Na,Rb)8(Al,Si)6O24(Cl,S)2$:Ti.

In one embodiment, the material is synthesized by a reaction according to Norrbo et al. (Norrbo, I.; Gluchowski, P.; Paturi, P.; Sinkkonen, J.; Lastusaari, M., Persistent Luminescence of Tenebrescent $Na_8Al_6Si_6O_{24}(Cl,S)_2$: Multifunctional Optical Markers. Inorg. Chem. 2015, 54, 7717-7724), which reference is based on Armstrong & Weller (Armstrong, J. A.; Weller, J. A. Structural Observation of Photochromism. Chem. Commun. 2006, 1094-1096) using stoichiometric amounts of Zeolite A and $Na_2SO_4$ as well as LiCl, NaCl, KCl and/or RbCl as the starting materials. The at least one dopant is added as an oxide, such as $TiO_2$. The material can be prepared as follows: Zeolite A is first dried at 500° C. for 1 h. The initial mixture is then heated at 850° C. in air for 48 h. The product is then freely cooled down to room temperature and ground. Finally, the product is reheated at 850° C. for 2 h under a flowing 12% $H_2$+88% $N_2$ atmosphere. The as-prepared materials are washed with water to remove any excess LiCl/NaCl/KCl/RbCl impurities. The purity can be verified with an X-ray powder diffraction measurement.

The present invention further relates to a luminescent material, wherein the luminescent material comprises the material according to one or more embodiments described in this specification.

The present invention further relates to a use of the luminescent composite material according to one or more embodiments described in this specification for receiving light at a first wavelength and emitting at least part of the thereby received energy as light at a second wavelength which is longer than the first wavelength.

In one embodiment, the luminescent material is configured to receive at least part of a light emitted by a lighting device and emitting at least part of the thereby received energy as light at a second wavelength which is longer than the first wavelength. In other words, the emitted light is at least partially absorbed by the luminescent material, and the energy thereby absorbed is at least partially emitted by the luminescent material so that the spectrum of the light emitted by the luminescent composite material differs from the spectrum of the light received by it. By the second wavelength being longer than the first wavelength is meant that the peak wavelength of the spectrum of light emitted by the luminescent material is higher than the peak wavelength of the spectrum of the light absorbed by the luminescent material.

In one embodiment, the luminescent material is a white light-emitting material. In one embodiment, the material is configured to be persistent for at least 50 hours, or at least 55 hours, or at least 60 hours, or at least 65 hours. The inventors surprisingly found out that the material has the ability to show a long afterglow of white color. Without limiting the invention to any specific theory about why the material according to one or more embodiments described in this specification results in the aforementioned advantage, it should be considered that the presence of a doping cation affects the material in a manner to enable it to be persistent for a long period of time.

The material can be used in different applications where the material's property of showing afterglow for a long period of time can be of use. The present invention further relates to a device, wherein the device comprises a material according to one or more embodiments described in this specification. In one embodiment, the device is a lighting arrangement. In one embodiment, the device is a light emitting device (LED), a display element or a fluorescent tube. In one embodiment the device is an organic light-emitting diode (OLED). In one embodiment, the device is an active-matrix organic light emitting diode (AMOLED). In one embodiment, the device is a headlight, a road lighting, a house lighting, a decorative lighting, a window lighting, a heads-up display (HUD). In one embodiment, the device is a display element for IoT (internet of things), IoE (internet of everything) or II (industrial internet) applications.

The luminescent material can be arranged in direct physical contact with a light emitting element, as is the case e.g. in LED chips encapsulated within an encapsulant forming or comprising the luminescent material. Alternatively, it can be arranged as or in a separate wavelength conversion element or a coating at a distance from the primary light emitting element. In the field of white LEDs, this kind of wavelength conversion material is usually known as "remote phosphor".

The material, the luminescent material, or the device can be used in e.g. watches and clocks, exit signalization, or toys. These can also be applied e.g. in a label on a bottle. The material can also be mixed as a powder in the raw materials used for the production of a plastic bottle, a sticker, a glass and a similar product. The products containing the material may also be conceived as jewelry. The material can be used as a display portion of a meter.

The present invention further relates to the use of the material according to one or more embodiments described in this specification in a security device. In one embodiment, the security device is selected from a group consisting of a thread, a foil and a hologram. In one embodiment the security device is an ink. In one embodiment, the security device is used on a banknote, a passport or an identity card. The present invention further relates to the use of the material according to one or more embodiments described in this specification in 3D printing.

The present invention further relates to the use of the material according to one or more embodiments described in this specification in imaging or in diagnostics. The material according to one or more embodiments described in this specification can be used in diagnosing a sample received from human or animal body. In one embodiment, the sample is selected from a group consisting of body fluids and tissues. In one embodiment, the sample comprises blood, skin, tissue and/or cells. The present invention further relates to the material according to one or more embodiments described in this specification for use in imaging or in diagnostics. The present invention further relates to the material according to one or more embodiments described in this specification for use in in vivo imaging or in in vivo diagnostics. In one embodiment, the imaging is medical imaging. This is because the material can be irradiated before being injected into the tissue to be studied, thus avoiding the damage caused by conventional materials requiring UV excitation after injection. In one embodiment, the material according to one or more embodiments described in this specification is used in a diagnostic assay. In one embodiment, the material according to one or more embodiments described in this specification is used in detection technology.

The embodiments of the invention described hereinbefore may be used in any combination with each other. Several of the embodiments may be combined together to form a further embodiment of the invention. A material, a device, or a use, to which the invention is related, may comprise at least one of the embodiments of the invention described hereinbefore.

The material has the added utility of it being able to be used in a large range of applications.

The material has the added utility of being chemically stable and being able to provide long afterglow.

The material has the added utility of being a low-cost material. The material has the added utility of being environmentally friendly as it does not contain any rare earth elements or other heavy metal elements.

EXAMPLES

Reference will now be made in detail to the embodiments of the present invention, examples of which are illustrated in the accompanying drawings.

The description below discloses some embodiments of the invention in such a detail that a person skilled in the art is able to utilize the invention based on the disclosure. Not all steps of the embodiments are discussed in detail, as many of the steps will be obvious for the person skilled in the art based on this specification.

Example 1

Preparing $(Li,Na)_8Al_6Si_6O_{24}(Cl,S)_2$:Ti

The material represented by the formula $(Li,Na)_8Al_6Si_6O_{24}(Cl,S)_2$:Ti was prepared in the following manner:

0.7000 g of dried (500° C. for 1 h) Zeolite A, 0.0600 g of Na$_2$SO$_4$ and 0.1700 g of LiCl powders were mixed together with 0.006 g of TiO$_2$ powder. The mixture was heated at 850° C. in air for 48 h. The product was freely cooled down to room temperature and ground. Finally, the product was re-heated at 850° C. for 2 h under a flowing 12% H$_2$+88% N$_2$ atmosphere.

Example 2

Preparing (Na,K)$_8$Al Si$_6$O$_{24}$(Cl,S)$_2$:Ti

The material represented by the formula (Na,K)$_8$Al$_6$Si$_6$O$_{24}$(Cl,S)$_2$:Ti was prepared in the following manner: 0.7000 g of dried (500° C. for 1 h) Zeolite A, 0.0600 g of Na$_2$SO$_4$ and 0.1800 g of NaCl and 0.0675 g KCl powders were mixed together with 0.006 g of TiO$_2$ powder. The mixture was heated at 850° C. in air for 48 h. The product was freely cooled down to room temperature and ground. Finally, the product was re-heated at 850° C. for 2 h under a flowing 12% H$_2$+88% N$_2$ atmosphere.

Example 3

Preparing (Na,Rb)$_8$Al Si$_6$O$_{24}$(Cl,S)$_2$:Ti

The material represented by the formula (Na,Rb)$_8$Al$_6$Si$_6$O$_{24}$(Cl,S)$_2$:Ti was prepared in the following manner: 0.7000 g of dried (500° C. for 1 h) Zeolite A, 0.0600 g of Na$_2$SO$_4$ and 0.4957 g of RbCl powders were mixed together with 0.006 g of TiO$_2$ powder. The mixture was heated at 850° C. in air for 48 h. The product was freely cooled down to room temperature and ground. Finally, the product was re-heated at 850° C. for 2 h under a flowing 12% H$_2$+88% N$_2$ atmosphere.

Example 4

Testing of a Sample of the Material Prepared in Example 1

A sample of the material prepared in example 1 was tested by measuring the emission and excitation spectra using a Varian Cary Eclipse luminescence spectrometer in phosphorescence mode. The excitation spectrum was collected while monitoring emission at 480 nm and the emission spectrum was obtained with excitation at 310 nm. The excitation source in the spectrometer is a Xe lamp. The standard Sun spectrum is that in ASTM G173-03. The results are presented in FIG. 1 indicate that the luminescence and afterglow are white and can be achieved with UV radiation and also with sunlight.

Figure 2:
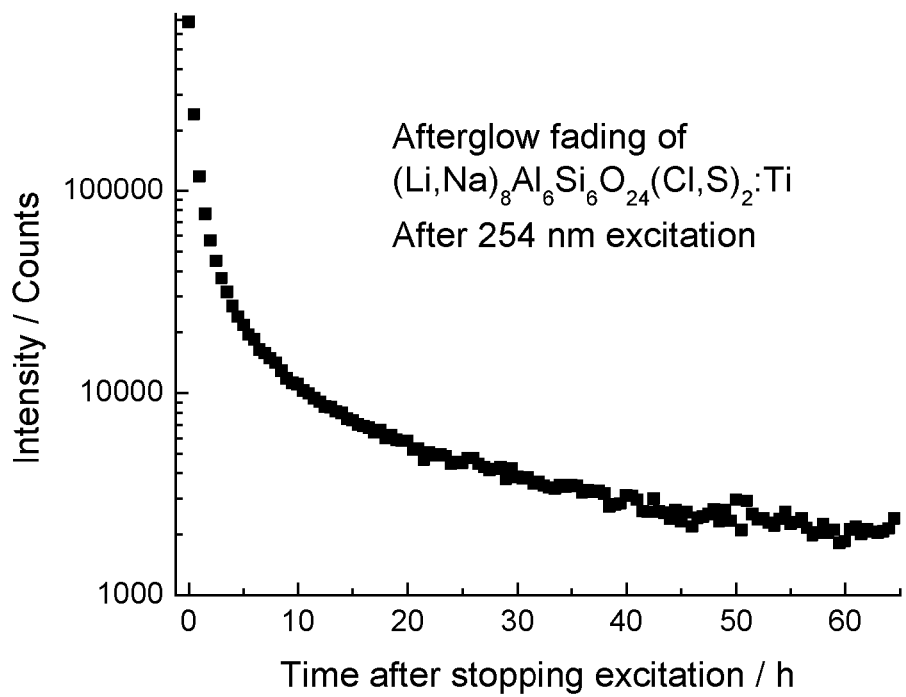
FIG. 2 discloses the test results of example 4.

Further, the a sample of the material prepared in example 1 was first irradiated for 30 min using a 4 W hand-held 254 nm UV lamp (UVP UVGL-25). The sample was then transferred to a Varian Cary Eclipse luminescence spectrometer and afterglow spectra were measured in bio/chemiluminescence mode every 15 min until 65 h from the stopping of the irradiation was reached. The thus obtained spectra were then integrated over the visible wavelength range (400-700 nm) using the program Origin (OriginLab). The results of the integrations represent the total luminescence intensity at each point in time. These were then plotted to give FIG. 2. Thus, the results are presented in FIG. 2 indicate that the prepared material show afterglow even over 65 hours.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A material represented by the following formula (I)

M'$_8$M''$_6$M'''$_6$O$_{24}$(X,X')$_2$:M''''    formula (I)

wherein
M' represents
a monoatomic cation of Li, or a monoatomic cation of K, or a monoatomic cation of Rb; or
a combination of at least two monoatomic cations of different alkali metals selected from Group 1 of the IUPAC periodic table of the elements, wherein the combination comprises 0-98 mol-% of the monoatomic cation of Na;
M'' represents a trivalent monoatomic cation of an element selected from Group 13 of the IUPAC periodic table of the elements, or of a transition element selected from any of Groups 3-12 of the IUPAC periodic table of the elements, or any combination of such cations;
M''' represents a monoatomic cation of an element selected from Group 14 of the IUPAC periodic table of the elements, or of an element selected from any of Groups 13 and 15 of the IUPAC periodic table of the elements, or of Zn, or any combination of such cations;
X represents an anion of an element selected from Group 17 of the IUPAC periodic table of the elements, or any combination of such anions, or wherein X is absent;
X' represents an anion of an element selected from Group 16 of the IUPAC periodic table of the elements, or any combination of such anions, or wherein X' is absent; and
M'''' represents a dopant cation of an element selected from transition metals of the IUPAC periodic table of the elements, or any combination of such cations;
with the proviso that at least one of X and X' is present.

2. The material of claim 1, wherein M' represents a combination of at least two monoatomic cations of different alkali metals selected from a group consisting of Li, Na, K, and Rb.

3. The material of claim 1, wherein M' represents a monoatomic cation of an alkali metal selected from a group consisting of Li, K, and Rb, or any combination of such cations.

4. The material of claim 1, wherein M' represents a combination of a monoatomic cation of Na with a monoatomic cation of Li, a monoatomic cation of K and/or a monoatomic cation of Rb.

5. The material of claim 1, wherein M'' represents a trivalent monoatomic cation of a metal selected from a group consisting of Al and Ga, or a combination of such cations.

6. The material of claim 1, wherein M'' represents a trivalent monoatomic cation of B.

7. The material of claim 1, wherein M''' represents a monoatomic cation of an element selected from a group consisting of Si and Ge, or a combination of such cations.

8. The material of claim 1, wherein M''' represents a monoatomic cation of an element selected from a group consisting of Al, Ga, N, P, and As, or any combination of such cations.

9. The material of claim 1, wherein X represents an anion of an element selected from a group consisting of F, Cl, Br, and I, or any combination of such anions.

10. The material of claim 1, wherein X' represents an anion of an element selected from a group consisting of O, S, Se, and Te, or any combination of such anions.

11. The material of claim 1, wherein M'''' represents a cation of an element selected from a group consisting of Ti, V, Cr, Mn, Fe, Co, Ni, Cu, and Zn, or any combination of such cations.

12. The material of claim 1, wherein the material is selected from a group consisting of $(Li,Na)_8Al_6Si_6O_{24}(Cl,S)_2$:Ti, $(Na,K)_8Al_6Si_6O_{24}(Cl,S)_2$:Ti, and $(Na,Rb)_8Al_6Si_6O_{24}(Cl,S)_2$:Ti.

13. The material of claim 1, wherein the material is luminescent.

14. The luminescent material of claim 13, wherein the luminescent material is a white light-emitting material.

15. The luminescent material of claim 13, wherein the luminesce persists for a period of at least 50 hours.

16. A device, characterized in that the device comprises a material as defined in claim 1.

17. The device of claim 16, wherein the device is a lighting arrangement.

18. The device of claim 16, wherein the device is a light emitting device, a display element, or a fluorescent tube.

* * * * *